United States Patent
Lu et al.

(10) Patent No.: US 9,625,824 B2
(45) Date of Patent: Apr. 18, 2017

(54) EXTREME ULTRAVIOLET LITHOGRAPHY COLLECTOR CONTAMINATION REDUCTION

(71) Applicant: Taiwan Semiconductor Manufacturing Company, Ltd., Hsin-Chu (TW)

(72) Inventors: Yen-Cheng Lu, New Taipei (TW); Jeng-Horng Chen, Hsin-Chu (TW); Shun-Der Wu, Tainan (TW); Tzu-Hsiang Chen, Hsinchu County (TW)

(73) Assignee: TAIWAN SEMICONDUCTOR MANUFACTURING COMPANY, LTD, Hsin-Chu (TW)

( * ) Notice: Subject to any disclaimer, the term of this patent is extended or adjusted under 35 U.S.C. 154(b) by 0 days.

(21) Appl. No.: 14/803,849

(22) Filed: Jul. 20, 2015

(65) Prior Publication Data

US 2016/0320708 A1    Nov. 3, 2016

Related U.S. Application Data

(60) Provisional application No. 62/155,111, filed on Apr. 30, 2015.

(51) Int. Cl.
*G03F 7/20* (2006.01)
*H05G 2/00* (2006.01)

(52) U.S. Cl.
CPC ........ *G03F 7/70025* (2013.01); *G03F 7/7055* (2013.01); *H05G 2/00* (2013.01);
(Continued)

(58) Field of Classification Search
CPC ... G03F 7/70025; G03F 7/7055; H05G 2/003; H05G 2/008; H05G 2/00; H05G 2/001; H05G 2/006; H05G 2/005
See application file for complete search history.

(56) References Cited

U.S. PATENT DOCUMENTS 8,278,636 B2   10/2012  Loopstra et al.
8,628,897 B1    1/2014  Lu et al.
(Continued)

FOREIGN PATENT DOCUMENTS

CN   101785369 A   7/2010
CN   103513519 A   1/2014
(Continued)

OTHER PUBLICATIONS

J.R. Freeman, S.S. Harilal, and A. Hassanein, "Enhancements of Extreme Ultraviolet Emission Using Prepulsed Sn Laser-Produced Plasmas for Advanced Lithography Applications," Journal of Applied Physics, 110, 083303 (2011), pp. 83303-1 to 83303-6.
(Continued)

Primary Examiner — Michelle M Iacoletti
(74) Attorney, Agent, or Firm — Haynes and Boone, LLP

(57) ABSTRACT

An extreme ultraviolet (EUV) radiation source module includes a target droplet generator, a first laser source, and a second laser source. The target droplet generator is configured to generate a plurality of target droplets. The first laser source is configured to generate a plurality of first laser pulses that heat the target droplets at respective excitation positions thereby generating a plurality of target plumes. At least one of the target droplets is heated at an excitation position different from that of other target droplets. The second laser source is configured to generate a plurality of second laser pulses that heat the target plumes thereby generating plasma emitting EUV radiation.

20 Claims, 6 Drawing Sheets

(52) U.S. Cl.
CPC ............. *H05G 2/001* (2013.01); *H05G 2/003* (2013.01); *H05G 2/005* (2013.01); *H05G 2/006* (2013.01); *H05G 2/008* (2013.01)

(56) References Cited

U.S. PATENT DOCUMENTS

| | | | |
|---|---|---|---|
| 8,653,437 B2 * | 2/2014 | Partlo | G03F 7/70033 250/205 |
| 8,679,707 B2 | 3/2014 | Lee et al. | |
| 8,691,476 B2 | 4/2014 | Yu et al. | |
| 8,709,682 B2 | 4/2014 | Chen et al. | |
| 8,715,890 B2 | 5/2014 | Tu et al. | |
| 8,722,286 B2 | 5/2014 | Yu et al. | |
| 8,753,788 B1 | 6/2014 | Yu et al. | |
| 8,764,995 B2 | 7/2014 | Chang et al. | |
| 8,765,330 B2 | 7/2014 | Shih et al. | |
| 8,765,582 B2 | 7/2014 | Hsu et al. | |
| 8,785,084 B2 | 7/2014 | Lu et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 2010/0258748 A1 * | 10/2010 | Vaschenko | H05G 2/003 250/504 R |
| 2012/0091893 A1 | 4/2012 | Yanagida et al. | |
| 2012/0223257 A1 * | 9/2012 | Nagai | G03F 7/70025 250/504 R |
| 2012/0305811 A1 * | 12/2012 | Wakabayashi | H05G 2/008 250/504 R |
| 2013/0062539 A1 | 3/2013 | Hayashi et al. | |
| 2014/0368802 A1 | 12/2014 | Yakunin et al. | |
| 2015/0208494 A1 * | 7/2015 | Rafac | H05G 2/008 250/504 R |

FOREIGN PATENT DOCUMENTS

| | | |
|---|---|---|
| JP | 2010045357 | 2/2010 |
| KR | 20120093216 | 8/2012 |
| TW | 201515518 A | 4/2015 |
| WO | WO 2014/090480 A1 | 6/2014 |

OTHER PUBLICATIONS

S. S. Harilal, T. Sizyuk, A. Hassanein, D. Campos, P. Hough, and V. Sizyuk, "The Effect of Excitation Wavelength on Dynamics of Laser-Produced Tin Plasma," Journal of Applied Physics, 109, 063306 (2011), pp. 063306-1 to 063306-9.

J. R. Freeman, S. S. Harilal, T. Sizyuk, A. Hassanein, and B. Rice, "Wavelength Dependence of Prepulse Laser Beams on EUV Emission from $CO_2$ Reheated Sn Plasma," Proc. of SPIE vol. 8322, 83220H, (2012), pp. 83220H-1 to 83220H-7.

Translated Notice of Allowance dated Dec. 17, 2016, International Application No. KR10-2015-0139148, 3 pages.

* cited by examiner

EXTREME ULTRAVIOLET LITHOGRAPHY COLLECTOR CONTAMINATION REDUCTION

PRIORITY DATA

This application claims the benefit of U.S. Prov. App. No. 62/155,111 entitled "Extreme Ultraviolet Lithography Collector Contamination Reduction," filed Apr. 30, 2015, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, the need to perform higher resolution lithography processes grows. One lithography technique is extreme ultraviolet lithography (EUVL). The EUVL employs scanners using light in the extreme ultraviolet (EUV) region, having a wavelength of about 1-100 nm. Some EUV scanners provide 4× reduction projection printing, similar to some optical scanners, except for that the EUV scanners use reflective rather than refractive optics, i.e., mirrors instead of lenses. One type of EUV light source is laser-produced plasma (LPP). LPP technology produces EUV light by focusing a high-power laser beam onto small tin droplet targets to form highly ionized plasma that emits EUV radiation with a peak of maximum emission at 13.5 nm. The EUV light is then collected by a LPP collector and reflected by optics towards a lithography target, e.g., a wafer. The LPP collector is subjected to damages and degradations due to the impact of particles, ions, radiation, and most seriously, tin deposition.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
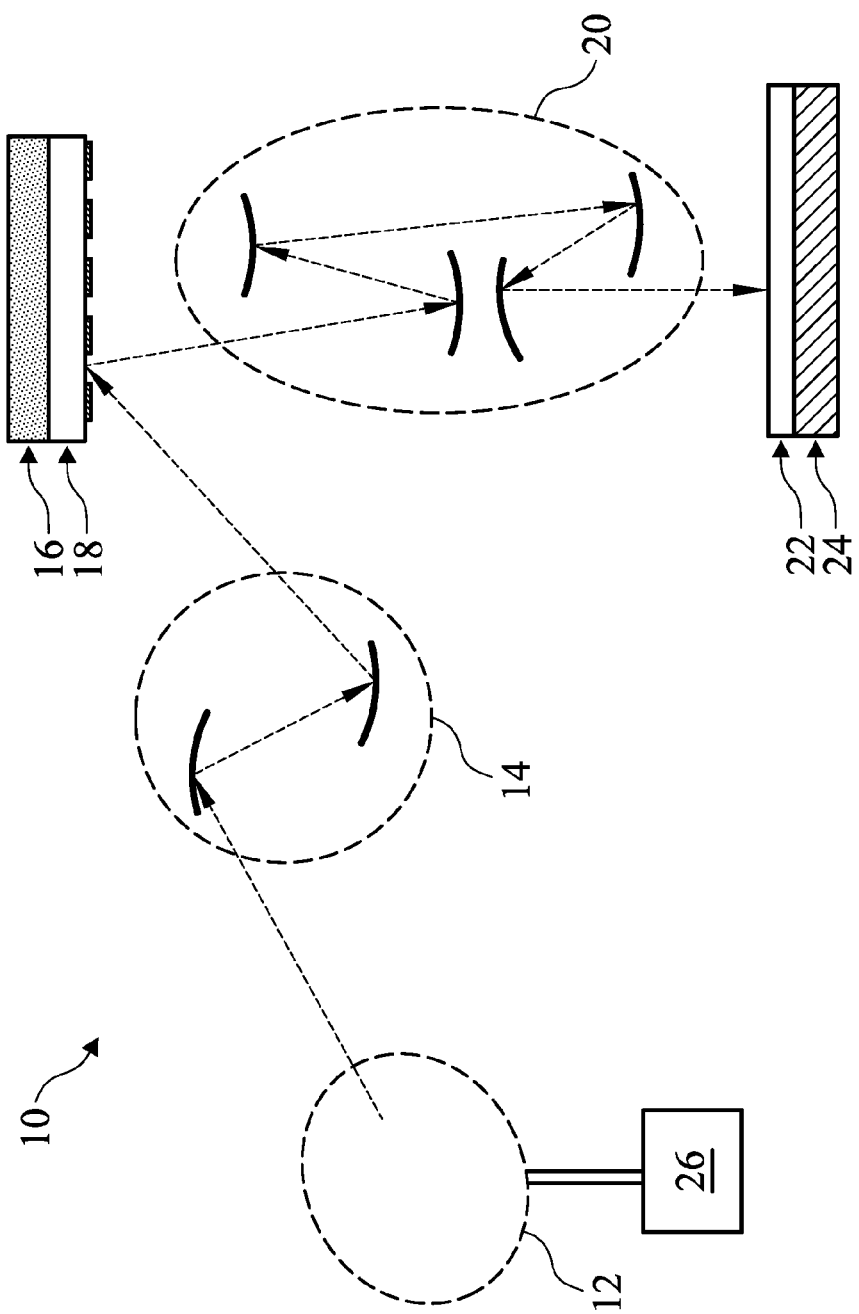
FIG. 1 is a schematic view of an EUV lithography system with a laser produced plasma (LPP) EUV radiation source, constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to extreme ultraviolet (EUV) lithography system and methods. More particularly, it is related to apparatus and methods for mitigating contamination on a collector in a laser produced plasma (LPP) EUV radiation source. The collector, also referred to as LPP collector or EUV collector, is an important component of the LPP EUV radiation source. It collects and reflects EUV radiation and contributes to overall EUV conversion efficiency. However, it is subjected to damages and degradations due to the impact of particles, ions, radiation, and debris deposition. An object of the present disclosure is directed to reducing debris deposition onto the LPP collector thereby increasing its usable lifetime.

FIG. 1 is a schematic and diagrammatic view of a lithography system 10, constructed in accordance with some embodiments. The lithography system 10 may also be generically referred to as a scanner that is operable to perform lithography exposing processes with respective radiation source and exposure mode. In the present embodiment, the lithography system 10 is an extreme ultraviolet (EUV) lithography system designed to expose a resist layer by EUV light (or EUV radiation). The resist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates an EUV light with a wavelength centered at about 13.5 nm. Accordingly, the radiation source 12 is also referred to as EUV radiation source 12. In the present embodiment, the EUV radiation source 12 utilizes a mechanism of dual pulse laser-produced plasma (LPP) to generate the EUV radiation, which will be further described later.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, reflective optics is employed.

The lithography system 10 also includes the mask stage 16 configured to secure the mask 18. In some embodiments, the mask stage 16 includes an electrostatic chuck (e-chuck) to secure the mask 18. This is because that gas molecules absorb EUV light and the lithography system for the EUV lithography patterning is maintained in a vacuum environment to avoid the EUV intensity loss. In the present disclosure, the terms mask, photomask, and reticle are used interchangeably. In the present embodiment, the lithography system 10 is an EUV lithography system, and the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask 18 may further include a capping layer, such as ruthenium (Ru), disposed on the ML for protection. The mask 18 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The lithography system 10 also includes a projection optics module (or projection optics box (POB)) 20 for imaging the pattern of the mask 18 on to a semiconductor substrate 22 secured on a substrate stage 24 of the lithography system 10. The POB 20 has refractive optics (such as for UV lithography system) or alternatively reflective optics (such as for EUV lithography system) in various embodiments. The light directed from the mask 18, carrying the image of the pattern defined on the mask, is collected by the POB 20. The illuminator 14 and the POB 20 are collectively referred to as an optical module of the lithography system 10.

In the present embodiment, the semiconductor substrate 22 is a semiconductor wafer, such as a silicon wafer or other type of wafer to be patterned. The semiconductor substrate 22 is coated with a resist layer sensitive to the EUV light in the present embodiment. Various components including those described above are integrated together and are operable to perform lithography exposing processes.

The lithography system 10 may further include other modules or be integrated with (or be coupled with) other modules. In the present embodiment, the lithography system 10 includes a gas supply module 26 designed to provide hydrogen gas to the radiation source 12. The hydrogen gas helps reduce contamination in the radiation source 12.

Figure 2:
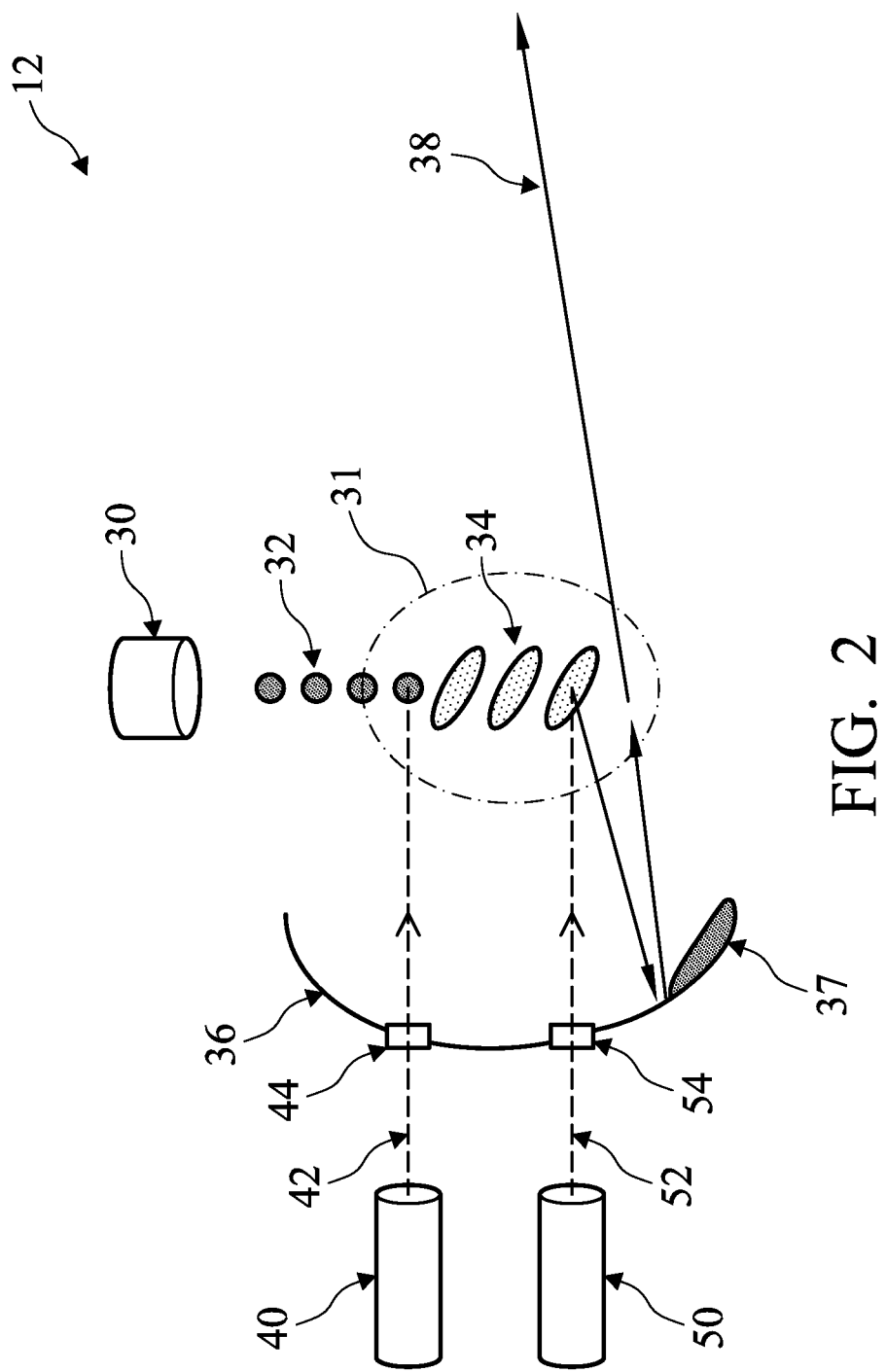
FIG. 2 is a diagrammatic view of the EUV radiation source in the EUV lithography system of FIG. 1, constructed in accordance with some embodiments.

FIG. 2 illustrates the radiation source 12 in a diagrammatical view, in accordance with some embodiments. The radiation source 12 employs a dual-pulse laser produced plasma (LPP) mechanism to generate plasma and further generate EUV light from the plasma.

Referring to FIG. 2, the radiation source 12 includes a target droplet generator 30, a first laser source 40, a second laser source 50, and a LPP collector 36. The target droplet generator 30 generates a plurality of target droplets 32. In an embodiment, the target droplets 32 are tin (Sn) droplets. In an embodiment, the tin droplets 32 each have a diameter about 30 microns (μm). In an embodiment, the tin droplets 32 are generated at a rate about 50 kilohertz (kHz) and are introduced into a zone of excitation 31 in the radiation source 12 at a speed about 70 meters per second (m/s). Other material can also be used for the target droplets 32, for example, a tin containing liquid material such as eutectic alloy containing tin, lithium (Li), and xenon (Xe).

The first laser source 40 produces laser pulses 42. The second laser source 50 produces laser pulses 52. In the present embodiment, the laser pulses 42 have less intensity and smaller spot size than the laser pulses 52. The laser pulse 42 is used to heat (or pre-heat) the target droplet 32 to create a low-density target plume 34, which is subsequently heated (or reheated) by the laser pulse 52, generating increased emission of EUV light. In the present disclosure, the laser pulses 42 are also referred to as the pre-pulses, and the laser pulses 52 the main pulses. In various embodiments, the pre-pulses 42 have a spot size about 100 μm or less, and the main pulses 52 have a spot size about 200-300 μm, such as 225 μm. The laser pulses 42 and 52 are generated to have certain driving powers to fulfill wafer volume production, such as 125 wafers per hour throughput. In an embodiment, the first laser pulse 42 is equipped with about 2 kilowatts (kW) driving power, and the second laser pulse 52 is equipped with about 19 kW driving power. In various embodiments, the total driving power of the first and second laser pulses, 42 and 52, is at least 20 kW, such as 27 kW. In an embodiment, the first laser source 40 is a carbon dioxide ($CO_2$) laser source. In another embodiment, the first laser source 40 is a neodymium-doped yttrium aluminum garnet (Nd:YAG) laser source. In an embodiment, the second laser source 50 is a $CO_2$ laser source.

The pre-pulses 42 and main pluses 52 are directed through windows (or lens) 44 and 54, respectively, into the zone of excitation 31. The windows 44 and 54 adopt a suitable material substantially transparent to the respective laser beams. The generation of the pre-pulses 42 and main pulses 52 are synchronized with the generation of the target droplets 32. As the target droplets 32 move through the excitation zone 31, the pre-pulses 42 heat the target droplets 32 and transform them into low-density target plumes 34. A delay between the pre-pulse 42 and the main pulse 52 is controlled to allow the target plume 34 to form and to expand to an optimal size and geometry. When the main pulse 52 heats the target plume 34, a high-temperature plasma is generated. The plasma emits EUV radiation 38, which is collected by the collector 36. The collector 36 further reflects and focuses the EUV radiation 38 for the lithography exposing processes. In an embodiment, a droplet catcher (not shown) is installed opposite the target droplet generator 30. The droplet catcher is used for catching excessive target droplets 32. For example, some target droplets 32 may be purposely missed by both the laser pulses 42 and 52.

The collector 36 is designed with proper coating material and shape, functioning as a mirror for EUV collection, reflection, and focus. In some embodiments, the collector 36 is designed to have an ellipsoidal geometry. In some embodiments, the coating material of the collector 36 is similar to the reflective multilayer of the EUV mask 18. In some examples, the coating material of the collector 36 includes a ML (such as a plurality of Mo/Si film pairs) and may further include a capping layer (such as Ru) coated on the ML to substantially reflect the EUV light. In some embodiments, the collector 36 may further include a grating structure designed to effectively scatter the laser beam directed onto the collector 36. For example, a silicon nitride layer is coated on the collector 36 and is patterned to have a grating pattern.

In an EUV lithography system, such as the EUV lithography system 10, EUV conversion efficiency is a key consideration. As such, the pre-pulses 42 and main pulses 52 are directed towards the target droplets 32 and target plumes 34 at proper angles for optimal EUV conversion efficiency. For example, the pre-pulses 42 may be aligned to interact with the target droplets 32 at an angle of few degrees (e.g., 5 degrees) off-normal. The main pulses 52 are also properly aligned with the target plumes 34 for maximum conversion efficiency.

Another consideration in the EUV lithography system 10 is the usable lifetime of the collector 36. During the above processes, the reflective surface of the collector 36 is subjected to the impact of various particles, ions, and radiation. Over time, the reflectivity of the collector 36 degrades due to particle accumulation, ion damages, oxidation, blistering, etc. Among these, particle (e.g., tin debris) deposition is a dominant factor.

One method of reducing the contamination of the collector 36 is to introduce hydrogen gas into the zone of excitation 31 and into a space proximate the reflective surface of the collector 36. In an embodiment, the hydrogen gas is provided by the gas supply module 26 (FIG. 1). Hydrogen gas has less absorption to the EUV radiation. Hydrogen gas reaching to the coating surface of the collector 36 (and the windows 44 and 54 as well) reacts chemically with tin to form stannane ($SnH_4$), a gaseous byproduct of the EUV generation process itself. Pumped out, stannane is then discarded. Other suitable gas may be alternatively or additionally used. However, using hydrogen gas flow does not completely prevent the contamination. The inventors of the present disclosure have observed that tin deposition tends to occur at specific spots on the collector 36, such as a spot 37 in FIG. 2. This may be explained as follows. The pre-pulses 42 excite the target droplets 32 at a specific location (referred to as an excitation position). The target plumes 34, which are typically pancake-shaped, are therefore oriented at a particular direction. The debris generated by the specific orientation of the target plumes 34 sputters relatively thicker tin debris at the specific spots 37 on the collector surface. The rate of tin deposition at the spots 37 exceeds the rate of tin removal by the hydrogen gas flow, even though the hydrogen gas flow may be sufficient for protecting other areas of the collector 36. As a result, tin debris accumulates on the reflective surface at the specific spots 37 of the collector 36, resulting in low collector reflectivity and significantly reduced collector usable lifetime. In the following sections, methods and apparatus are disclosed for further reducing the tin contamination.

Figure 3:
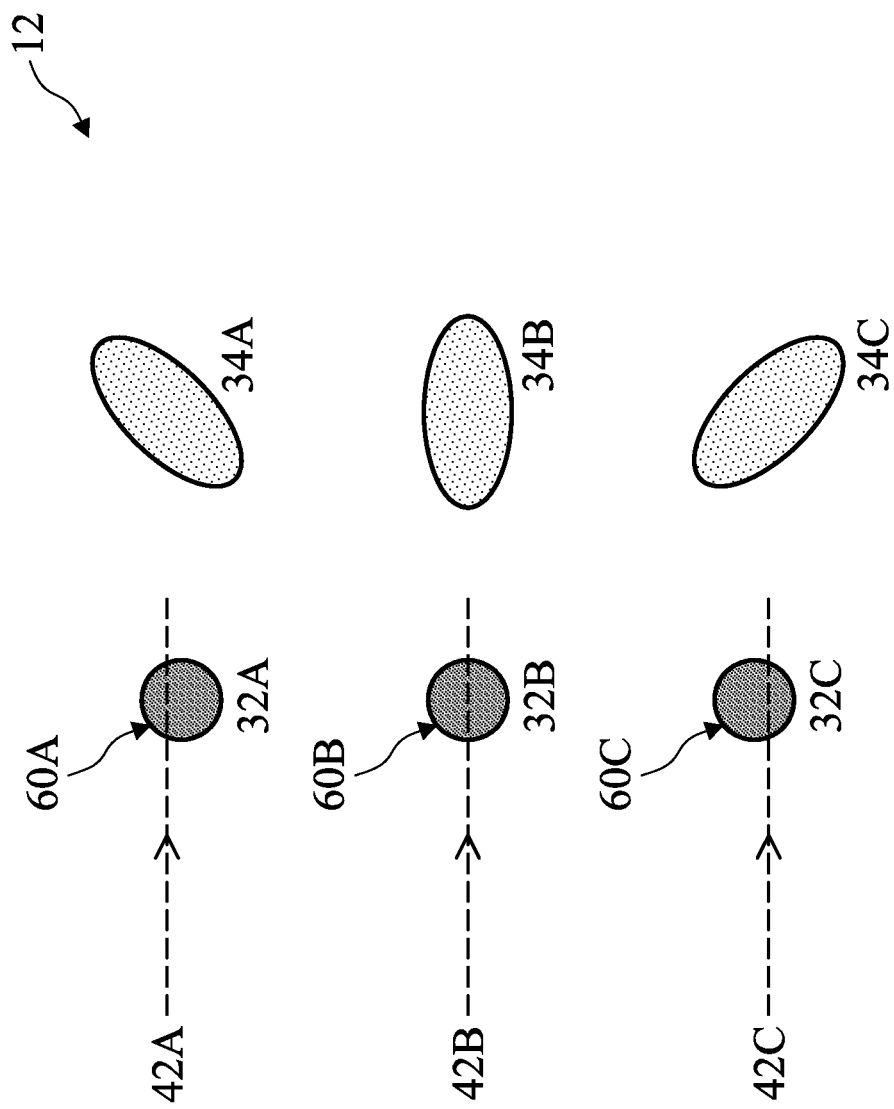
FIG. 3 illustrates a pre-pulse laser hitting different excitation positions of target droplets, which may be configured in the EUV radiation source of FIG. 2.

Refer to FIG. 3, shown therein is an illustration of the correlation between the excitation position on the target droplet 32 and the orientation of the resultant target plume 34. The inventors of the present disclosure have discovered that by heating the target droplets 32 at different positions (relative to a normal position), one can control the orientation of the resultant target plumes 34. For example, when the pre-pulse 42B heats the target droplet 32B at its center (the excitation position 60B is approximately at the normal position), the resultant target plume 34B is oriented horizontally (its head and tail are at a normal position). When the pre-pulse 42A heats the target droplet 32A above its center (the excitation position 60A is above 60B), the resultant target plume 34A is oriented head-down and tail-up. When the pre-pulse 42C heats the target droplet 32C below its center (the excitation position 60C is below 60B), the resultant target plume 34C is oriented head-up and tail-down. Of course, the "up," "down," "above," and "below" as herein used are relative and are for the ease of description.

Figure 4:
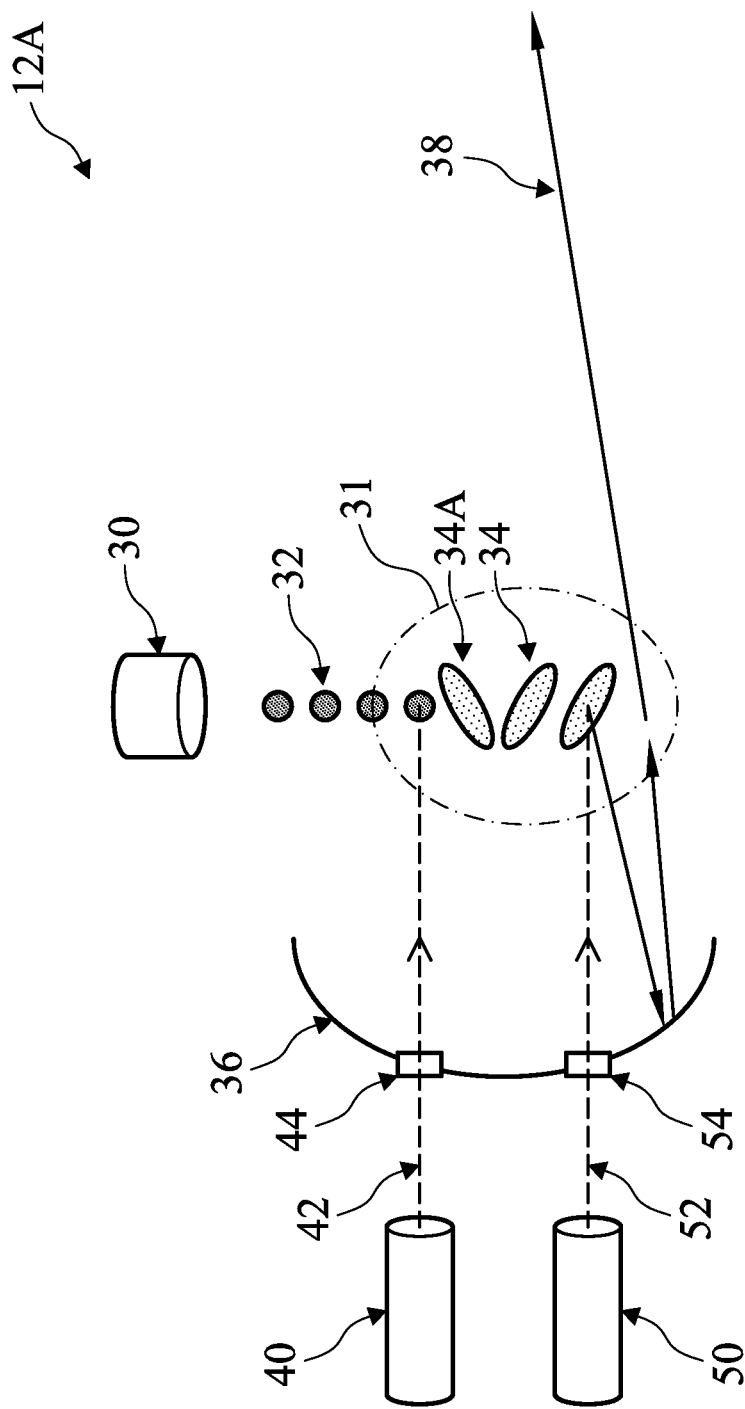
FIG. 4 is a diagrammatic view of the EUV radiation source in the EUV lithography system of FIG. 1, constructed in accordance with some embodiments.

The above concept is utilized and embodied in an EUV radiation source 12A (FIG. 4), constructed according to various aspects of the present disclosure. Referring to FIG. 4, the EUV radiation source 12A is similar to the EUV radiation source 12. One difference is that the EUV radiation source 12A produces multiply-oriented target plumes 34. In another word, the target plumes 34 are not oriented all at the same direction. At least one target plume, 34A, is oriented differently than other target plumes 34. As a result, when the main pulse 52 heats the target plume 34A, the particles (e.g., tin debris) generated therefrom tend to fall at a different direction than those generated by the target plumes 34. This has an effect of "spreading" out the particles, thereby limiting the rate of particle deposition at any specific spot on the collector 36. Combining this technique with the gas flow cleaning method, embodiments of the present disclosure are able to further reduce contamination on the collector 36.

In an embodiment, the multiply-oriented target plumes 34 are generated by coordinating the target droplet generator 30 and the first laser source 40 such that the pre-pulses 42 heat the target droplets 32 at varying excitation positions. In an embodiment, the target droplets 32 are generated at a fixed rate (e.g., 50 kHz) and moves at a fixed speed (e.g., 70 m/s) through the excitation zone 31. The first laser source 40 is timely controlled such that the pre-pulses 42 are generally synchronized with the target droplets 32 but at least one pre-pulse 42 is generated at an earlier or a later timing than a normal timing. This is further illustrated in FIG. 5.

Figure 5:
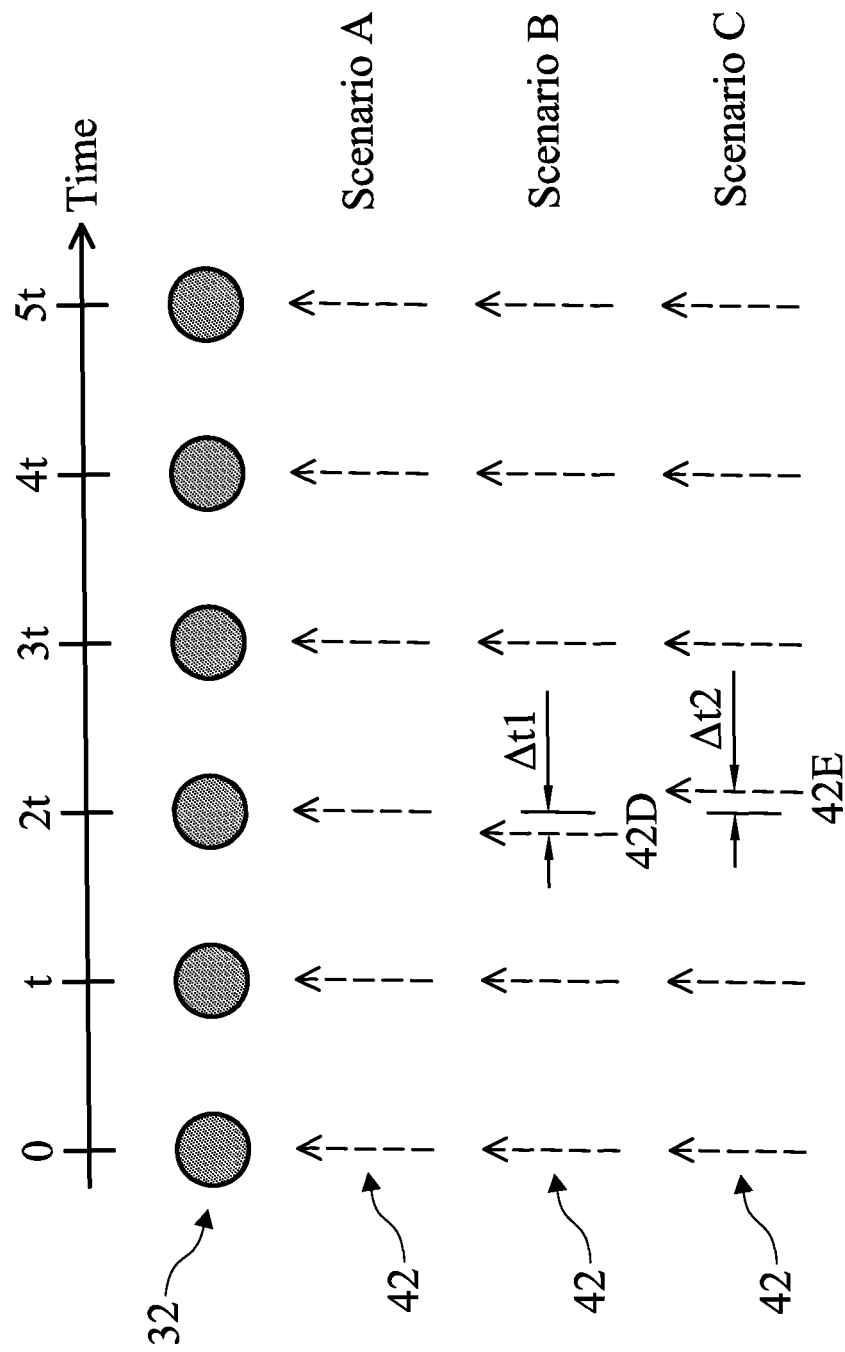
FIG. 5 illustrates different configurations of laser pre-pulses by the EUV radiation source of FIG. 4, constructed in accordance with some embodiments.

Referring to FIG. 5, in an embodiment, the target droplets 32 are generated one at a time and a train of target droplets 32 move through the excitation zone 31. As illustrated, the first target droplet enters the excitation zone at time 0 (relatively speaking), the second target droplet at time "t," which is a normal delay between two target droplets, the third target droplet at time "2t," and so on. To further this embodiment, the first laser source 40 is configured to generate the pre-pulses 42 generally synchronously with the target droplets. Three scenarios are illustrated in FIG. 5.

In Scenario A, the pre-pulses 42 are fully synchronized with the target droplets 32, and the delay between two pre-pulses 42 is also "t." All pre-pulses 42 heat the respective target droplets 32 at the same excitation position. Of course, the excitation positions may be at the normal position, or off-normal. However, the resultant target plumes 34 are uniformly oriented (see FIG. 3).

In Scenario B, the pre-pulses 42 are generally synchronized with the target droplets 32, but with one pre-pulse 42D generated earlier than the normal timing by a time $\Delta t1$. When the pre-pulse 42D heats the respective target droplet, the resultant target plume will be oriented differently than other target plumes (see FIG. 3).

In Scenario C, the pre-pulses 42 are generally synchronized with the target droplets 32, but with one pre-pulse 42E generated later than the normal timing by a time Δt2. When the pre-pulse 42E heats the respective target droplet, the resultant target plume will be oriented differently than other target plumes (see FIG. 3).

In embodiments, the ranges of Δt1 and Δt2 are limited by the size of the target droplets 32. They may be further limited by a range of desirable orientations of the target plumes 34 which eventually affect the conversion efficiency of the EUV radiation source 12 (and 12A). In an embodiment, the ranges of Δt1 and Δt2 are both limited to be less than about 100 nanoseconds (ns). In an embodiment, some of the pre-pulses 42 are purposely configured to be outside the range so that they do not heat the target droplets 32. The corresponding target droplets 32 are not heated by the main pulses 52 either, and are reserved for EUV dose margin purposes. These target droplets 32 may be collected by the target droplet catcher described above.

In embodiments, the second laser source 50 is configured to be fully synchronized with the first laser source 40, i.e., there is a fixed time delay between a pre-pulse 42 and a corresponding main pulse 52. For example, if the first laser source 40 is configured to generate the pre-pulses 42 as shown in Scenario B, then the second laser source 50 is configured such that the main pulse corresponding to the pre-pulse 42D is also generated earlier than a normal timing by Δt1. This is to ensure that the main pulse 52 heats the target plumes properly.

In an embodiment, the timing for generating the pre-pulses 42 and main pulses 52 are controlled by one or more timing generators external to the laser sources 40 and 50. In another embodiment, such timing controller is built into (integrated with) the laser sources 40 and 50.

In an embodiment, various acceptable excitation positions may be identified by stepping the delays Δt1 and Δt2 in their respective ranges. At each step, an acceptance test may be performed. The acceptance test may take into account measurements such as EUV conversion efficiency, the amount of debris deposition, the size and direction of debris deposition, etc. Among the acceptable excitation positions, some may be jointly selected for the EUV lithography system 10. One criterion for selecting the multiple excitation positions is that the overall EUV conversion efficiency is acceptable (even though it may not be maximal) and the contamination of the collector 36 is sufficiently low. In an embodiment, the selected excitation positions are directly correlated to the timing of the pre-pulses 42 and the main pulses 52.

Figure 6:
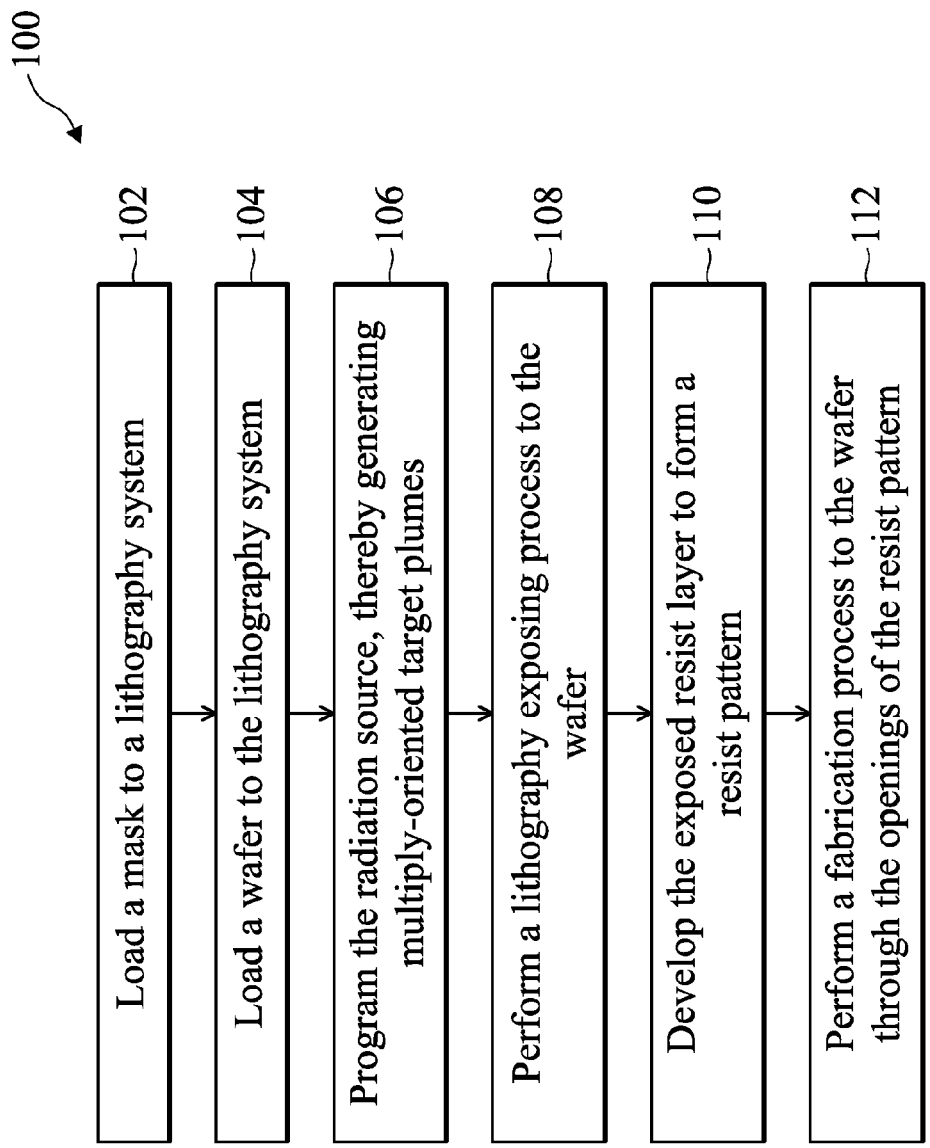
FIG. 6 is a flowchart of a lithography process constructed in accordance with some embodiments.

FIG. 6 is a flowchart of a method 100 for an EUV lithography process implemented by the EUV lithography system 10, constructed in accordance with some embodiments. Additional operations can be provided before, during, and after the method 100, and some operations described can be replaced, eliminated, or moved around for additional embodiments of the method. The method 100 is an example, and is not intended to limit the present disclosure beyond what is explicitly recited in the claims.

The method 100 includes an operation 102 which loads an EUV mask, such as mask 18 to the lithography system 10 that is operable to perform an EUV lithography exposing process. The mask 18 includes an IC pattern to be transferred to a semiconductor substrate, such as the wafer 22. The operation 102 may further include various steps, such as securing the mask 18 on the mask stage 16 and performing an alignment.

The method 100 includes an operation 104 which loads the wafer 22 to the lithography system 10. The wafer 22 is coated with a resist layer. In the present embodiment, the resist layer is sensitive to the EUV radiation from the radiation source 12 of the lithography system 10.

The method 100 includes an operation 106 which programs the EUV radiation source 12 to produce multiply-oriented target plumes. Operation 106 includes configuring the target droplet generator 30, configuring the first laser source 40, and configuring the second laser source 50. The target droplet generator 30 is configured to generate the target droplets 32 with proper material, proper size, proper rate, and proper movement speed and direction. The first laser source 40 is configured to generate the pre-pulses 42 generally synchronously with the generation of the target droplets 32. However, some of the pre-pulses 42 are to be delayed or advanced in time such that they will heat the respective target droplets 32 at different excitation positions. The second laser source 50 is configured to be synchronized with the first laser source 40. There is a proper delay between each of the pre-pulses 42 and the corresponding main pulse 52.

The method 100 includes an operation 108 by performing a lithography exposing process to the wafer 22 in the lithography system 10. In the operation 108, the target droplet generator 30 and the laser sources 40 and 50 are turned on and are operated according to the configuration in the operation 106. The resultant target plumes 34 have various orientations. As the main pulses 52 heat the multiply-oriented target plumes 34, plasma is generated, which emits EUV radiation. At the same time, the debris (e.g., tin debris) spreads out, not accumulating at a specific location of the collector 36. In an embodiment, the method 100 further includes introducing a hydrogen gas flow proximate the surface of the collector 36. The hydrogen gas flow effectively removes the tin debris from the surface of the collector 36.

During the operation 108, the EUV radiation generated by the radiation source 12 is illuminated on the mask 18 (by the illuminator 14), and is further projected on the resist layer coated on the wafer 22 (by the POB 20), thereby forming a latent image on the resist layer. In some embodiments, the lithography exposing process is implemented in a scan mode.

The method 100 may include other operations to complete the lithography process. For example, the method 100 may include an operation 110 by developing the exposed resist layer to form a resist pattern having a plurality of openings defined thereon. Particularly, after the lithography exposing process at the operation 108, the wafer 22 is transferred out of the lithography system 10 to a developing unit to perform a developing process to the resist layer. The method 100 may further include other operations, such as various baking steps. As one example, the method 100 may include a post-exposure baking (PEB) step between the operations 108 and 110.

The method 100 may further include other operations, such as an operation 112 to perform a fabrication process to the wafer through the openings of the resist pattern. In one example, the fabrication process includes an etch process to the wafer 22 using the resist pattern as an etch mask. In another example, the fabrication process includes an ion implantation process to the wafer 22 using the resist pattern as an implantation mask.

Although not intended to be limiting, one or more embodiments of the present disclosure provide many benefits to the manufacturing of a semiconductor device. For example, embodiments of the present disclosure provide apparatus and methods for effectively generating EUV radiation while preserving the usable lifetime of LPP collectors. Embodiments of the present disclosure can be implemented or integrated into existing EUV lithography systems.

In one exemplary aspect, the present disclosure is directed to an extreme ultraviolet (EUV) radiation source module. The EUV radiation source module includes a target droplet generator, a first laser source, and a second laser source. The target droplet generator is configured to generate a plurality of target droplets. The first laser source is configured to generate a plurality of first laser pulses that heat the target droplets thereby generating a plurality of target plumes, wherein at least one of the target droplets is heated at an excitation position different from that of other target droplets. The second laser source is configured to generate a plurality of second laser pulses that heat the target plumes thereby generating plasma emitting EUV radiation.

In another exemplary aspect, the present disclosure is directed to an EUV lithography system. The EUV lithography system includes a radiation source, a mask stage, a wafer stage, and an optical module. The radiation source includes a target droplet generator, a first laser source, a second laser source, and a collector. The target droplet generator is configured to generate a plurality of target droplets. The first laser source is configured to generate a plurality of first laser pulses that heat the target droplets thereby generating a plurality of target plumes, wherein at least one of the target droplets is heated at an excitation position different from that of other target droplets. The second laser source is configured to generate a plurality of second laser pulses that heat the target plumes thereby generating plasma emitting EUV radiation. The collector configured to collect and reflect the EUV radiation. The mask stage is configured to secure an EUV mask. The wafer stage is configured to secure a semiconductor wafer. The optical module is designed to direct the EUV radiation from the radiation source to image an integrated circuit (IC) pattern defined on the EUV mask to the semiconductor wafer.

In another exemplary aspect, the present disclosure is directed to an extreme ultraviolet (EUV) lithography process for patterning a target. The EUV lithography process includes loading a semiconductor wafer to an EUV lithography system. The an EUV lithography system includes a radiation source generating EUV radiation, a mask stage holding an EUV mask, a wafer stage configured to secure the semiconductor wafer, and an optical module designed to direct the EUV radiation from the radiation source to image an IC pattern defined on the EUV mask to the semiconductor wafer. The radiation source includes a target droplet generator, a first laser source, a second laser source, and a collector. The target droplet generator is configured to generate a plurality of target droplets. The first laser source is configured to generate a plurality of first laser pulses that heat the target droplets thereby generating a plurality of target plumes. The second laser source is configured to generate a plurality of second laser pulses that heat the target plumes thereby generating a plasma emitting EUV radiation. The collector is configured to collect and reflect the EUV radiation. The EUV lithography process further includes programming the radiation source such that generation of the target droplets and first laser pulses are generally synchronized with a normal timing, but at least one of the first laser pulses is generated at a timing different from the normal timing. The EUV lithography process further includes exposing the semiconductor wafer by the EUV radiation.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) radiation source module, comprising:
   a target droplet generator configured to generate a plurality of target droplets;
   a first laser source configured to generate a plurality of first laser pulses that heat the target droplets thereby generating a plurality of target plumes corresponding to the target droplets respectively, wherein at least one of the target droplets is heated at an excitation position different from that of other target droplets such that its corresponding target plume has a different orientation than other target plumes; and
   a second laser source configured to generate a plurality of second laser pulses that heat the target plumes thereby generating plasma emitting EUV radiation.

2. The EUV radiation source module of claim 1, further comprising:
   a collector configured to collect and reflect the EUV radiation.

3. The EUV radiation source module of claim 1, wherein:
   the target droplet generator is configured to generate the target droplets one at a time with a same delay between two contiguous target droplets; and
   the first laser source is configured to generate the first laser pulses one at a time with generally the same delay between two first laser pulses, wherein at least one of the first laser pulses is generated earlier in timing than other first laser pulses.

4. The EUV radiation source module of claim 1, wherein:
   the target droplet generator is configured to generate the target droplets one at a time with a same delay between two contiguous target droplets; and
   the first laser source is configured to generate the first laser pulses one at a time with generally the same delay between two first laser pulses, wherein at least one of the first laser pulses is generated later in timing than other first laser pulses.

5. The EUV radiation source module of claim 1, wherein the first and second laser sources are synchronized such that there is a fixed time delay between each of the first laser pulses and a corresponding one of the second laser pulses.

6. The EUV radiation source module of claim 1, wherein the first and second laser sources are configured such that at least one of the target droplets is not heated by either the first or the second laser pulses.

7. The EUV radiation source module of claim 1, wherein the target droplets include tin (Sn).

8. The EUV radiation source module of claim 1, wherein a driving power of the first laser pulse and the second laser pulse is at least 20 kW.

9. The EUV radiation source module of claim 1, wherein at least one of the first and the second laser pulses is $CO_2$ laser.

10. An EUV lithography system comprising:
a radiation source, wherein the radiation source includes:
   a target droplet generator configured to generate a plurality of target droplets;
   a first laser source configured to generate a plurality of first laser pulses that heat the target droplets thereby generating a plurality of target plumes corresponding to the target droplets respectively, wherein at least one of the target plumes has a different orientation than other target plumes;
   a second laser source configured to generate a plurality of second laser pulses that heat the target plumes thereby generating plasma emitting EUV radiation; and
   a collector configured to collect and reflect the EUV radiation;
a mask stage configured to secure an EUV mask;
a wafer stage configured to secure a semiconductor wafer; and
an optical module designed to direct the EUV radiation from the radiation source to image an integrated circuit (IC) pattern defined on the EUV mask to the semiconductor wafer.

11. The EUV lithography system of claim 10, wherein the radiation source is configured such that generation of the target droplets and the first laser pulses are synchronized except that at least one of the first laser pulses is generated at timing different from other first laser pulses relative to their corresponding target droplets.

12. The EUV lithography system of claim 11, wherein the at least one of the first laser pulses is generated earlier than other first laser pulses relative to their corresponding target droplets.

13. The EUV lithography system of claim 11, wherein the at least one of the first laser pulses is generated later than other first laser pulses relative to their corresponding target droplets.

14. The EUV lithography system of claim 10, wherein the first and second laser sources are synchronized such that there is a fixed time delay between each of the first laser pulses and a corresponding one of the second laser pulses.

15. The EUV lithography system of claim 10, wherein the target droplets include tin (Sn) or tin containing material.

16. The EUV lithography system of claim 10, wherein at least one of the first and second laser pulses is $CO_2$ laser.

17. The EUV lithography system of claim 10, further comprising:
a gas supply configured to introduce hydrogen gas into a space proximate a reflective surface of the collector.

18. An extreme ultraviolet (EUV) lithography process for patterning a target, comprising:
loading a semiconductor wafer to an EUV lithography system that includes:
   a radiation source that includes:
      a target droplet generator configured to generate a plurality of target droplets;
      a first laser source configured to generate a plurality of first laser pulses that heat the target droplets thereby generating a plurality of target plumes;
      a second laser source configured to generate a plurality of second laser pulses that heat the target plumes thereby generating a plasma emitting EUV radiation; and
      a collector configured to collect and reflect the EUV radiation;
   a mask stage holding an EUV mask;
   a wafer stage configured to secure the semiconductor wafer; and
   an optical module designed to direct the EUV radiation from the radiation source to image an IC pattern defined on the EUV mask to the semiconductor wafer;
programming the radiation source such that generation of the target droplets and first laser pulses are synchronized except that at least one of the first laser pulses is generated at timing different from other first laser pulses relative to their corresponding target droplets; and
exposing the semiconductor wafer by the EUV radiation.

19. The EUV lithography process of claim 18, further comprising:
programming the radiation source such that generation of the first and second laser pulses are synchronized.

20. The EUV lithography process of claim 18, further comprising:
introducing a hydrogen gas flow into a space proximate a reflective surface of the collector.

* * * * *